United States Patent [19]

Thibeault

[11] Patent Number: 4,672,337
[45] Date of Patent: Jun. 9, 1987

[54] VLF/HF EMI FILTER

[75] Inventor: Richard L. Thibeault, Waterford, Conn.

[73] Assignee: The United States of America as represented by the Secretary of the Navy, Washington, D.C.

[21] Appl. No.: 802,639

[22] Filed: Nov. 27, 1985

[51] Int. Cl.$^4$ .......................... H03H 7/01; H04B 3/28; H01Q 1/52

[52] U.S. Cl. ..................................... 333/167; 333/12; 333/168; 333/185; 343/728

[58] Field of Search ................ 333/167, 177, 181–185, 333/12, 168, 202, 175, 206, 176; 455/300, 301, 307, 317, 82, 269, 272–274, 281–283, 286–296; 343/725, 726, 728, 745, 749, 764, 816, 820, 821, 822, 829, 830, 841, 850, 722

[56] References Cited

U.S. PATENT DOCUMENTS 2,144,950  1/1939  Wiessner .............................. 333/167
2,204,179  6/1940  George ................................. 333/81

OTHER PUBLICATIONS

Buchsbaum–"Eliminating 21 MC. Interference", *Radio and Television News*, Oct., 1952; pp. 48–50 and 171.
Sekhri–"Power Line Filter", *IBM Technical Disclosure Bulletin*, vol. 17, No. 7, Dec. 1974, pp. 1998–1999.
Haskett et al.–"Radio and TV Interference", *Electronics World*, May 1964; pp 39–41.

*Primary Examiner*—Marvin L. Nussbaum
*Attorney, Agent, or Firm*—Michael J. McGowan; Arthur A. McGill; Prithvi C. Lall

[57] ABSTRACT

An EMI filter for use in a low frequency radio receiver. The device is inserted in the signal line between the receiver and its antenna to provide both common mode and differential mode filtering of out-of-band interfering HF signals which are picked up on the antenna as well as on the signal line and attendant cable shields.

5 Claims, 4 Drawing Figures

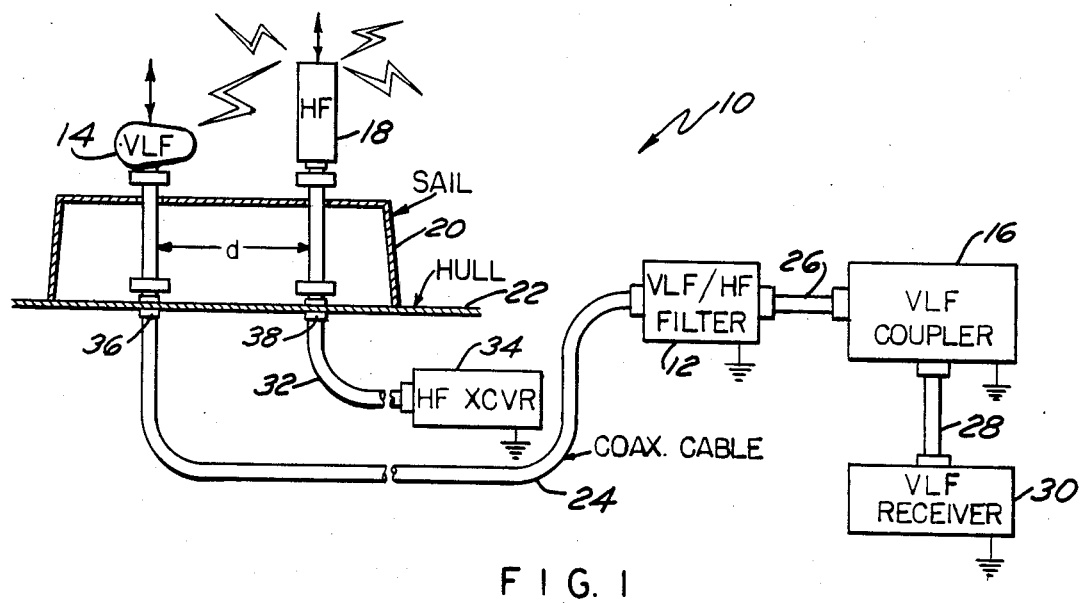
F I G. 1
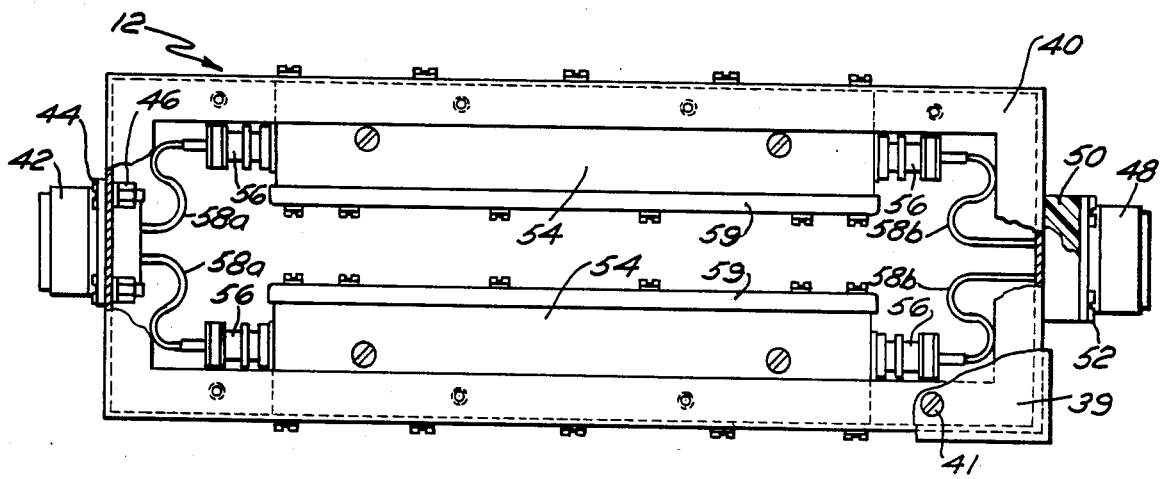
F I G. 2
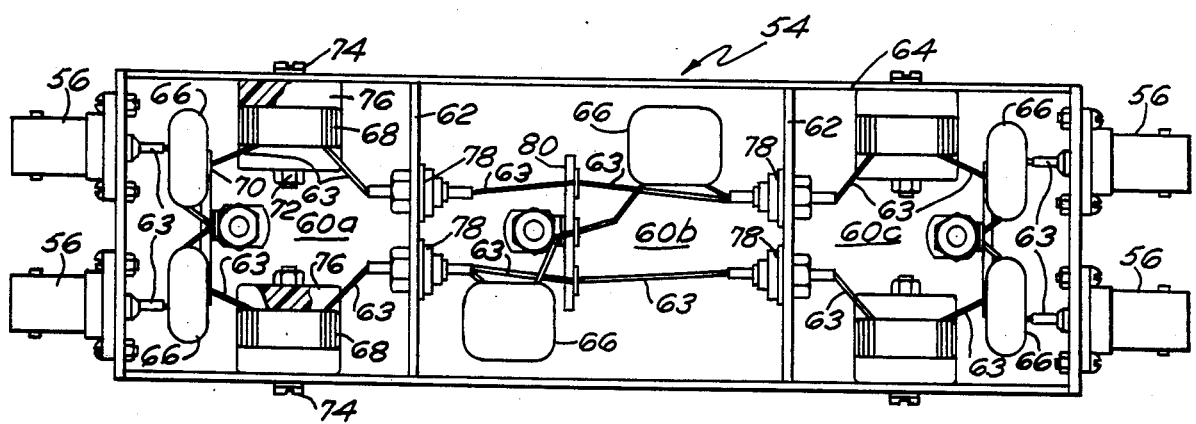
F I G. 3

VLF/HF EMI FILTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to an electrical filter and more particularly to a device for selectively eliminating the electromagnetic interference (EMI) effects produced by a high frequency (HF) transmitter on a proximate, very low frequency (VLF) receiver.

(2) Description of the Prior Art

High frequency EMI often interferes with the operation of VLF receivers when HF transmit and VLF receive antennas are located in close proximity thereto, such as occurs in submarine sails. Previously, a single-ended, seven pole, elliptic function filter was installed internally in the balanced input, single-ended output antenna coupler which interfaces the VLF receiver to its loop antenna. This filter was intended to act as a low pass EMI filter to prevent HF band signals from interfering with VLF reception.

Such a filter design however was found to not work. Instead, radio operators must, when the submarine platform is operating at periscope depth, lower the mast which carries the VLF loop antenna until it is submerged. The seawater, which does not appreciably block radio waves in the VLF range, severely attenuates those in the HF band, to act as an effective EMI filter. This submergence method however is of limited effectiveness as it does not work on non-submerged platforms or when the sea state is too high since the VLF loop could then come out of the water due to wave action.

The ultimate effect on submarine operations is that VLF reception has to be postponed until such time as all HF transmission operations have ceased which undesirably extends the time the submarine must remain at periscope depth, thereby increasing its chances of being detected.

SUMMARY OF THE INVENTION

Accordingly, it is a general purpose and object of the present invention to eliminate HF interference in a VLF coupler system while transmitting on a HF band. A further object is to improve reception of VLF signals by making VLF reception transparent to simultaneous HF operations (SIMOP).

These objects are accomplished with the present invention by providing an EMI filter for use in a low frequency radio receiver. The device is inserted in the signal line between the receiver and its antenna to provide both common mode and differential mode filtering of out-of-band interfering HF signals which are picked up on the antenna as well as on the signal line and attendant cable shields.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein:

FIG. 1 shows a block diagram of the present VLF/HF filter installed in a submarine communications system.

FIG. 2 shows a top view of an in-line VLF/HF filter of FIG. 1 having a cover plate removed.

FIG. 3 shows a top view of a filter apparatus for a typical antenna loop.

DESCRIPTION OF THE PREFERRED EMBODIMENT

Figure 4:
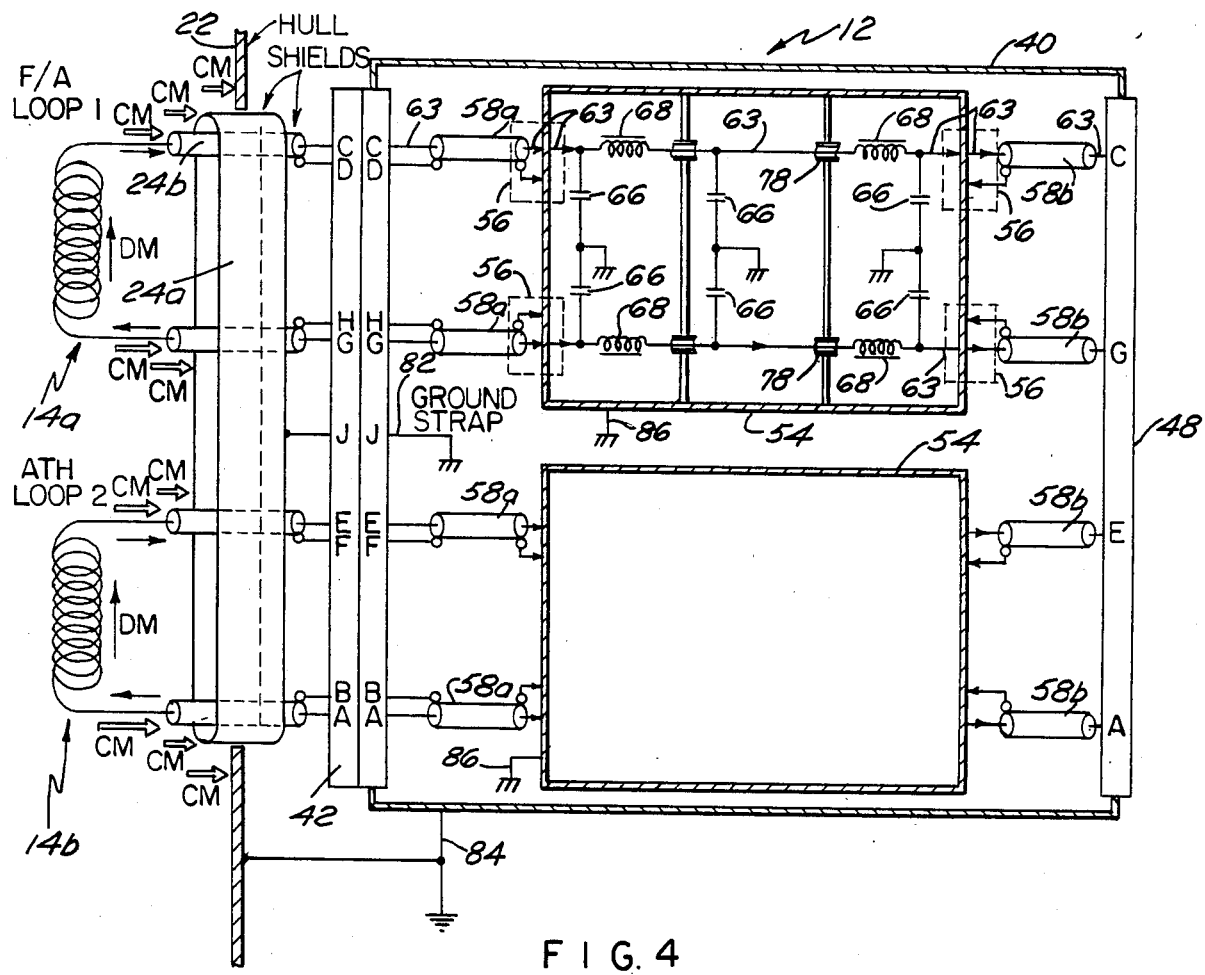
FIG. 4 shows a schematic diagram for the apparatus of FIG. 3.

The present invention provides a dual, four port, five pole, passive filter network, balanced with respect to ground on both input and output ends, which functions as a low pass Chebishev filter for frequencies from 0 Hz through 650 kHz. This preferred embodiment of the instant invention is inserted between the balanced outputs of a VLF loop antenna and the balanced inputs of a VLF coupler.

Referring now to FIG. 1 there is shown a block diagram of a typical installation of a VLF/HF EMI filter system 10 aboard a submarine. Filter 12 is installed between VLF antenna 14 and VLF coupler 16. Both VLF and HF antennas, 14 and 18 respectively, are located on a submarine sail 20. Each antenna can be extended or retracted to any position between full-up or full-down. HF antenna 18 is in close proximity to VLF antenna 14, being spaced a distance d apart. Distance d is typically the order of 5 feet. However, distance d may be zero which is the case when a multifunction antenna is used. Sail 20 extends above submarine hull 22 which encloses not only filter 12 but also coax cable 24 which connects VLF antenna 14 to filter 12, coax cable 26 connecting filter 14 to VLF coupler 16 and coax cable 28 connecting coupler 16 to a VLF receiver 30. HF antenna 18 is connected by coax cable 32 to a HF transceiver 34. Cables 24 and 32 pass through hull 22 at penetrators 36 and 38 respectively.

FIG. 2 shows the physical embodiment of the VLF/HF EMI filter 12 having a metal cover 39 (removed for clarity). With cover 39 in place on shield box 40, a total metal enclosure is provided about remaining filter components. This cover overlaps the four edges of shield box 40 in order to provide maximum EMI protection being attached with a plurality of metal fasteners 41. Filter 12 comprises the high conductivity metal shield box 40, exhibiting at least 10 skin depths of thickness to VLF fields, with input and output connectors for conducting signals from the VLF antenna into filter 12 and out to the VLF coupler respectively. Input connector 42 is electrically connected to shield box 40 by a plurality of nuts 44 and bolts 46 shown at the filter's input end which may be of any metal. Connector 48 at the output end is isolated from shield box 40 by a nylon or teflon insulator block 50. Screws 52 may be of nylon or any suitable non-conducting material. Inside shield box 40 are shown two, identical, side-mounted, shielded filter boxes 54, preferably made of copper exhibiting at least 10 skin depths of thickness to HF fields. Filter boxes 54 are physically connected to shield box 40 so as to provide a high conductance electrical connection between each filter box 54 and shield box 40. The filter boxes are connected to input connector 42 and output connector 48 by a plurality of VLF signal lines comprising BNC connectors 56 and coax cables 58. Each filter box 54 has an overlapping cover 59 attached thereto with a plurality of metal fasteners.

FIG. 3 shows a top view of a filter box 54 with overlapping access cover 59 removed. Signal lines form the VLF antenna are connected to box 54 through BNC chassis connectors 56, one connector pair being located at each end of box 54. Since the VLF antenna is a balanced antenna having two loops, i.e. fore and aft (F/A) and athwartships (ATH), the signal inputs to the filter box are selected to maintain this balance by utilizing a separate BNC connector 56 for each signal line. Thus, two BNC connectors are required at both the input and output ends of each filter box 54. Box 54 is internally divided into three sections, 60a, 60b and 60c by two additional internal copper walls 62 in order to physically and electrically isolate each section. Input section 60a of filter 54 comprises a pair of input capacitors 66, one each connected from each input signal line 63 to metal case 64, and a pair of series connected in-line inductors 68. For shock and vibration protection, capacitors 66 are mounted on standoffs 70 and inductors 68 are mounted to case 64 by using nylon or other suitably non-conductive nuts 72 and bolts 74 in conjunction with rubber or other resilient non-conducting spacers 76. In order to pass through the solid copper walls 62 the output of inductors 68 (signal lines 63) are connected to corresponding feedthrough capacitors 78. The second section 60b comprises a pair of capacitors 66 connected from signal line 63 to case 64 in a balanced arrangement using mount 80. Signal lines 63 exit the second section via a second pair of feedthrough capacitors 78. The third, or output, section 60c is identical to first section 60a in construction except that it operates in reverse with respect to signal direction.

The above described arrangement of components eliminate common mode (CM) and differential mode (DM) EMI received from the colocated HF transmitting antenna. The HF antenna emits effective radiated power (ERP) in the kilowatt range causing spurious voltages to be induced into the VLF loop antenna system which are in excess of 5 volts. Differential mode interference occurs because the VLF loop antenna presents a low value impedance at high frequencies. Common mode interference occurs because vertical sections of unshielded wire (e.g., signal lines to the antenna) and ungrounded ends of concentric shielding around lead-in wire appear to HF band signals as vertical whip antennas.

FIG. 4 is a schematic representation of the VLF/HF EMI filter 12 showing the F/A and ATH VLF loop antennas, 14a and 14b respectively, and the associated cable and shields 24a and b. Also depicted are representations of the HF interference voltages induced onto the VLF antenna loops, cabling and shields. Common mode interference, induced into the VLF antenna and components via capacitive coupling from the HF transmit antenna, is indicated by the large arrows and the designation CM. Differential mode interference, induced into the VLF antenna and associated components via inductive coupling from the HF transmit antenna 18 of FIG. 1, is indicated by the small arrows and the designation DM. The HF signals which cause generation of CM and DM in the VLF antenna and associated cabling do not penetrate the ships hull 22. Interfering signals induced into the antenna and associated cabling are carried on the VLF signal lines and shields through hull penetration connector 36 of FIG. 1 and into the submarine. Once inside the ship these HF signals can then reradiate. The design of the VLF/HF EMI filter systematically eliminates the effects of the CM and DM interference by combining single-point grounding techniques to combat CM interference on the shields and balanced filter techniques to combat CM and DM on the signal lines. Also, for proper operation of the filter, shield box 40 must have a low impedance connection 82 to the ships hull. It is noted that components shown in upper illustrated box 54 are the same as lower box 54 which are not shown.

The single-point ground techniques for the elimination of CM on the shields are as follows. When overall shield 24a enters the VLF/HF EMI filter through input connector 42 it is attached to the inside of the shield box using as short a ground strap 82 as possible. This causes the CM on overall shield 24a to be neutralized. CM interference on individual shields 24b is neutralized by connection through BNC connector 56 to filter box 54, which provides a low impedance ground 86 to filter shield box 40. Signal lines 63, which are enclosed in coaxial lines 58a, are connected from VLF/HF EMI filter input connector 42 to filter box input connector 56. Signal lines 63 then continue through filter box 54 to output BNC connectors 56. Next, signal lines 63, enclosed in coaxial lines 58b, are connected from filter box output BNC connectors 56 to VLF/HF EMI filter output connector 48. All coaxial line 58a shields are connected to the VLF/HF EMI filter input connector 42 and to the filter box input BNC connectors 56. By doing this, a single-point ground is provided to the VLF antenna 14 by VLF/HF EMI filter 12 via filter box 54 thereby removing VLF band EMI due to shipboard ambient magnetic fields while also providing an internal shielding against reradiation of HF interference inside shield box 40.

Coaxial line 58b shields are connected to the filter box output connectors 56 on one end and brought up to the VLF/HF EMI filter output connector 48, but not connected to it. The use of coaxial cable 58b in this manner is done to prevent recontamination of the output portion of signal line 63 by any internally reradiated HF interference that might be emitted by coaxial lines 58a as well as to allow a separate single-point ground to be maintained in coaxial cable 26 (FIG. 1) on its run to the VLF coupler 16. The shields on coaxial cables 58a and 58b should be extended as close as possible to input connector 42 and output connector 48.

CM and DM interference enter the filter on the VLF signal lines. The filter is thus designed to eliminate both types of HF interference. CM is eliminated by the balanced design of the filter in conjunction with the reactive components, and DM is eliminated by the filtering action of the reactive components. When dealing with VLF, single-point grounds are used to eliminate ground loop currents which are a source of self-interference in this band.

The advantages that the present filter has over the previous filter is that filter 12 works. The old filter with its physical placement within the VLF coupler, the ground scheme used and the unbalanced design, simply did not stop the HF EMI from getting through to the VLF receiver. The advantage over the 2nd prior art method, i.e., that of running with the VLF loop antenna submerged, of course only applies to submarines, and then only during submerged operations when sea states are low. Otherwise, this method also does not work or at best is severely restrictive.

What has thus been described is an EMI filter for use in a low frequency radio receiver. The device is inserted in the signal line between the receiver and its antenna to provide both common mode and differential mode filtering of out-of-band interfering HF signals which are picked up on the antenna as well as on the signal line and attendant cable shields.

Obviously many modifications and variations of the present invention may become apparent in light of the above teachings. For example: the skin thickness, conductive and nonconductive materials, capacitors and chokes may be varied to suit the expected operating environment. Also, isolator 50 of FIG. 2 may be omitted and an in-line isolator used in cable 26 of FIG. 1 instead.

In light of the above, it is therefore understood that within the scope of the appended claims, the invention may be practiced otherwise than as specifically described.

What is claimed is:

1. In a relatively low frequency (LF) radio receiver system having an associated loop antenna operating in close proximity to a much higher frequency (HF), high power transmitting antenna, a LF radio receiver and a shielded signal conducting cable, an EMI filter comprising:

a single point system ground;

one or more first filter means, electrically connected to said system ground, said signal cable and said LF reveiver, for eliminating HF differential mode and common mode undesired EMI signals induced into said LF radio receiver loop antenna by transmissions from said proximate HF antenna by conducting said differential mode and common mode EMI signals on said loop antenna and said signal cable to said system ground, each said one or more first filter means further comprising a number of discrete reactive elements cooperatively connected to form a low pass filter which is balanced with respect to said system ground, for passing radio frequency signals of relatively low frequency while rejecting said HF EMI signals on said loop antenna; and one or more second filter means, electrically connected to said system ground and said signal cable shield, for intercepting and eliminating HF common mode EMI signals capable of being conducted to said low frequency radio receiver by conduction means other than said LF receiving loop antenna by conducting said common mode EMI signals to said system ground, said conduction means further comprising reradiation from RF shields and direct radiation paths.

2. An EMI filter according to claim 1 wherein said second filter means further comprises enclosure means connected to said system ground for suppressing said common mode EMI.

3. An EMI filter according to claim 2 wherein said enclosure means further comprises two or more first enclosures for housing said one or more first filtering means such that said discrete reactive filter elements of each of said first filter means are physically separated into two or more groups of components.

4. An EMI filter according to claim 3 wherein said enclosure means means additionally comprises a second enclosure for housing said two or more first enclosures wherein said second enclosure receives the grounds of said RF shields and said first enclosure and is itself connected to said system ground.

5. An EMI filter according to claim 4 wherein said two or more first enclosures and said second enclosure are each of a metal of sufficient conductivity and thickness as to be greater than 10 skin depths with respect to all signals which constitute said EMI and constructed such that radiation paths through said one or more enclosures are minimized.

* * * * *